(12) United States Patent
Sumiya et al.

(10) Patent No.: US 9,960,031 B2
(45) Date of Patent: *May 1, 2018

(54) PLASMA PROCESSING APPARATUS AND PLASMA PROCESSING METHOD

(71) Applicant: HITACHI HIGH-TECHNOLOGIES CORPORATION, Tokyo (JP)

(72) Inventors: Masahiro Sumiya, Hikari (JP); Motohiro Tanaka, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/293,480

(22) Filed: Oct. 14, 2016

(65) Prior Publication Data

US 2017/0032955 A1 Feb. 2, 2017

Related U.S. Application Data

(60) Continuation of application No. 14/509,935, filed on Oct. 8, 2014, now Pat. No. 9,496,147, which is a
(Continued)

(30) Foreign Application Priority Data

Mar. 16, 2010 (JP) ................................ 2010-058841

(51) Int. Cl.
*H01L 21/302* (2006.01)
*H01L 21/02* (2006.01)
(Continued)

(52) U.S. Cl.
CPC ...... *H01L 21/0206* (2013.01); *H01J 37/3266* (2013.01); *H01J 37/32192* (2013.01);
(Continued)

(58) Field of Classification Search
CPC ............ H01J 37/32192; H01J 37/3266; H01L 21/02002; H01L 21/0206; H01L 21/02164;
(Continued)

(56) References Cited

U.S. PATENT DOCUMENTS 6,503,364 B1  1/2003 Masuda et al.
6,573,190 B1  6/2003 Izawa et al.
(Continued)

FOREIGN PATENT DOCUMENTS

JP   2001-244247 A   9/2001
JP   2002-359234 A  12/2002
(Continued)

OTHER PUBLICATIONS

Office Action, dated Nov. 20, 2015, which issued during the prosecution of Taiwanese Patent Application No. 102148735, which corresponds to the present application (Taiwan IPO Search Report attached).

(Continued)

*Primary Examiner* — Lan Vinh
(74) *Attorney, Agent, or Firm* — Baker Botts L.L.P.

(57) ABSTRACT

In a plasma processing apparatus comprising a processing chamber arranged in a vacuum chamber, a sample stage arranged under the processing chamber and having its top surface on which a wafer to be processed is mounted, a vacuum decompression unit for evacuating the interior of the processing chamber to reduce the pressure therein, and introduction holes arranged above said sample stage to admit process gas into the processing chamber, the wafer having its top surface mounted with a film structure and the film structure being etched by using plasma formed by using the process gas, the film structure is constituted by having a resist film or a mask film, a poly-silicon film and an
(Continued)

insulation film laminated in this order from top to bottom on a substrate and before the wafer is mounted on the sample stage and the poly-silicon film underlying the mask film is etched, plasma is formed inside the processing chamber to cover the surface of members inside the processing chamber with a coating film containing a component of Si.

5 Claims, 15 Drawing Sheets

Related U.S. Application Data division of application No. 14/046,773, filed on Oct. 4, 2013, now abandoned, which is a division of application No. 12/855,302, filed on Aug. 12, 2010, now Pat. No. 8,557,709.

(51) Int. Cl.
*H01J 37/32* (2006.01)
*H01L 21/28* (2006.01)
*H01L 21/311* (2006.01)
*H01L 21/3213* (2006.01)
*H01L 21/3065* (2006.01)
*H01L 21/67* (2006.01)

(52) U.S. Cl.
CPC .. *H01L 21/02002* (2013.01); *H01L 21/02164* (2013.01); *H01L 21/02274* (2013.01); *H01L 21/02334* (2013.01); *H01L 21/28123* (2013.01); *H01L 21/3065* (2013.01); *H01L 21/31116* (2013.01); *H01L 21/32136* (2013.01); *H01L 21/32137* (2013.01); *H01L 21/67259* (2013.01)

(58) Field of Classification Search
CPC ......... H01L 21/02274; H01L 21/02334; H01L 21/28123; H01L 21/3065; H01L 21/31116; H01L 21/32136; H01L 21/32137

USPC ....... 438/706, 710, 712, 714, 720, 725, 758, 438/762; 216/58, 67
See application file for complete search history.

(56) References Cited

U.S. PATENT DOCUMENTS

| | | | |
|---|---|---|---|
| 6,872,322 B1 | 3/2005 | Chow et al. | |
| 6,905,800 B1 | 6/2005 | Yuen et al. | |
| 7,029,594 B2 | 4/2006 | Yasui et al. | |
| 7,204,913 B1 | 4/2007 | Singh et al. | |
| 8,043,972 B1* | 10/2011 | Liu | H01L 21/02063 216/80 |
| 9,496,147 B2* | 11/2016 | Sumiya | H01J 37/32192 |
| 2002/0072016 A1 | 6/2002 | Chen et al. | |
| 2003/0066487 A1* | 4/2003 | Suzuki | C23C 16/511 118/723 MW |
| 2004/0209005 A1 | 10/2004 | Goto et al. | |
| 2006/0000797 A1* | 1/2006 | Adams | H01J 37/32082 216/37 |
| 2006/0162861 A1 | 7/2006 | O'Meara et al. | |
| 2007/0063259 A1 | 3/2007 | Derderian et al. | |
| 2007/0232067 A1 | 10/2007 | Hirota et al. | |
| 2009/0101993 A1 | 4/2009 | Park et al. | |

FOREIGN PATENT DOCUMENTS

| | | |
|---|---|---|
| JP | 2004-031380 A | 1/2004 |
| JP | 2008-244292 A | 10/2008 |
| JP | 2010-50310 A | 3/2010 |

OTHER PUBLICATIONS

Japanese Official Action dated Oct. 14, 2014, for JP Application No. 2013-255576.
A. Le Gouil et al., "Chemical analysis of deposits formed on the reactor walls during silicon and metal gate etching processes," *J. Vac. Sci. Technol.*, B24(5), Sep./Oct. 2006, pp. 2191-2197.
*Semiconductor International*, vol. 2008/1, pp. 21-27.

* cited by examiner

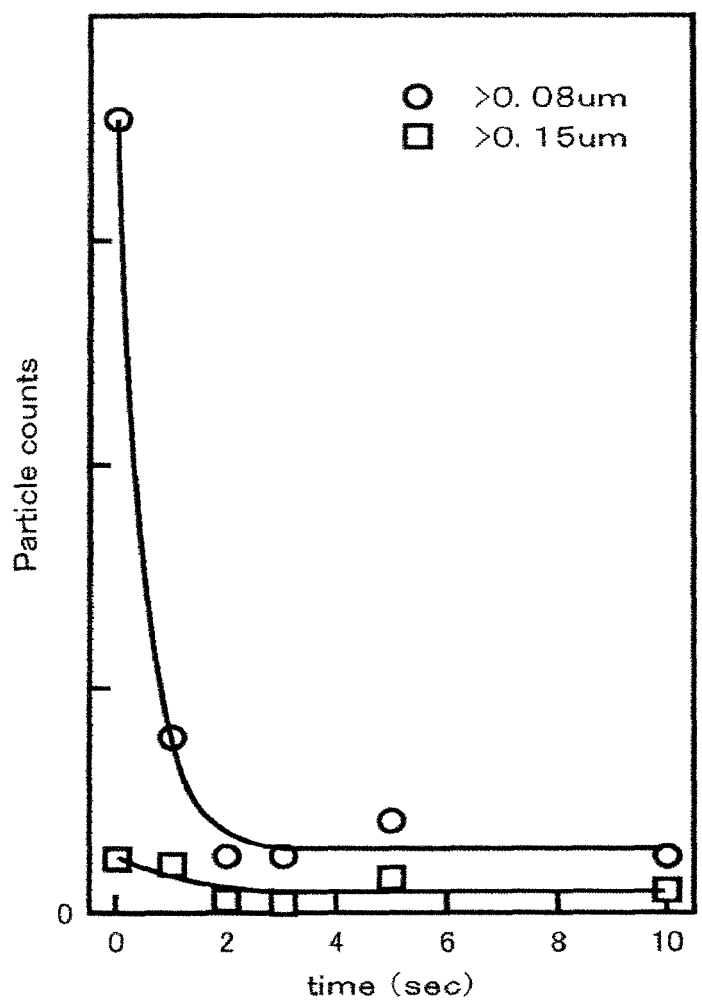

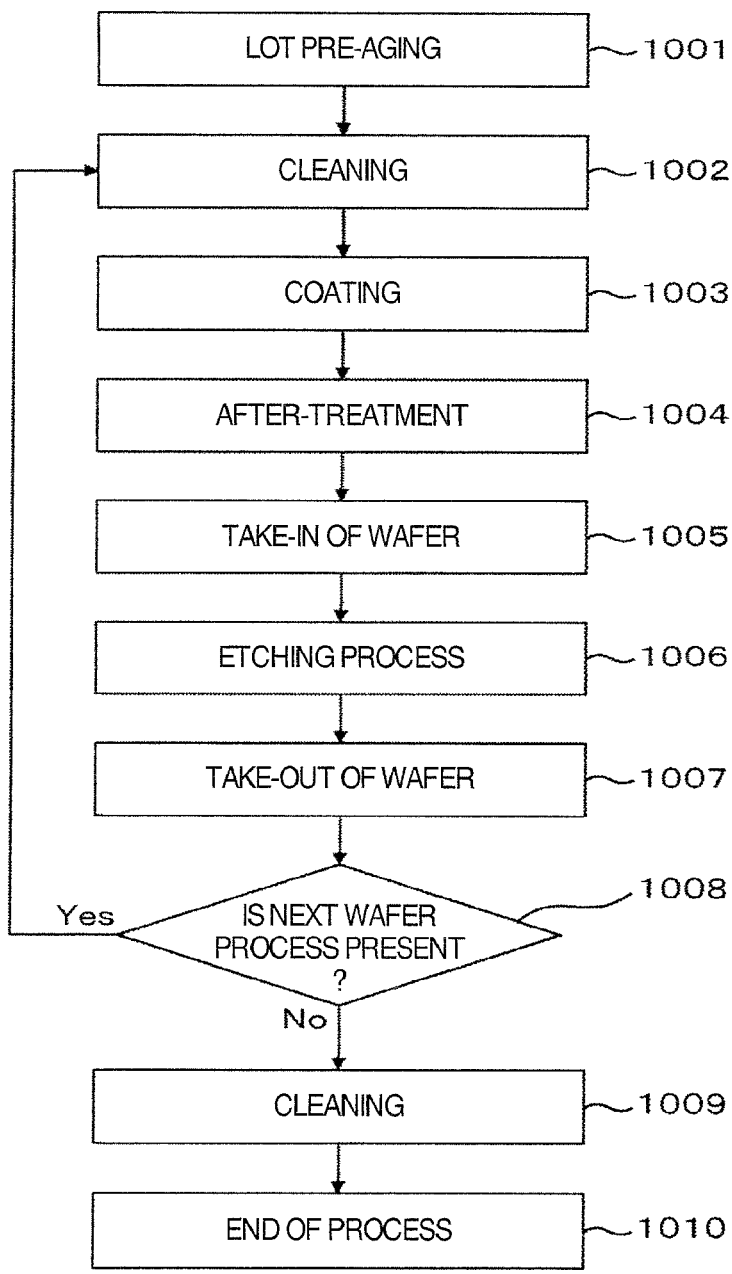

PLASMA PROCESSING APPARATUS AND PLASMA PROCESSING METHOD

CROSS REFERENCE TO RELATED APPLICATIONS

This application is a Continuation application of application Ser. No. 14/509,935, filed Oct. 8, 2014, which is a Divisional application of application Ser. No. 14/046,773, filed Oct. 4, 2013, which is a Divisional application of application Ser. No. 12/855,302, filed Aug. 12, 2010, which claims benefit of priority to Japanese Patent Application No. 2010-058841, filed Mar. 16, 2010, the contents of all of which are incorporated herein by reference in their entirety.

BACKGROUND OF THE INVENTION

The present invention relates a plasma processing apparatus and more particularly, to a plasma processing method suitable for performing a surface treatment of a semiconductor substrate and the like by using plasma.

In recent years, a semiconductor device has been miniaturized and thus, an etching process for transferring a mask formed by lithography to an underlying film is required to have higher dimensional accuracy, that is, higher CD (Critical Dimension). In the mass-production field, in addition to the high CD controllability, assurance of the reproducibility of CD is of an important problem. Generally, accounted for causes of a change in the CD are the deposition of a reaction product generated from a material being processed on the inner wall of an etching chamber, the consumption of members inside the chamber attributable to their long-term use and the change in temperature and the like factor of the members inside the chamber followed by a change in the probability of deposition of a radical on the inner wall of the chamber and the like, leading to the eventual change in a plasma affecting the etching performance.

Further, in a miniaturized transistor, the capacity of a gate insulation film needs to be increased in order to control the short channel effect and conventionally, this problem is solved by decreasing the thickness of a gate oxide film. With the thickness of the gate oxide film reduced, however, a leakage current increases and hence, a material having a higher dielectric constant (High-k) has been introduced for use as the gate insulation film. As the High-k material substituting for the oxide film, a hafnium oxide film ($HfO_2$) can be enumerated. But, because there is an unfit of material between the conventional poly-silicon (Poly-Si) electrode and the hafnium oxide film ($HfO_2$), a structure having a metal film of a proper work function is needed. Of various kinds of the metal material enumerated, TiN and La have been used as described in 'Semiconductor International Vol. 2008/1 (Non-Patent Document 1).

Conventionally, in the plasma processing apparatus, cleaning based on plasma is performed wafer by wafer or lot by lot and for processes targeting a carbon (C), an oxide film, Poly-Si and a nitriding film, cleaning to be executed in a plasma principally containing either fluorine (F), chlorine (Cl) or oxygen (O) or a mixture of any of them has been used. In the event that the inner wall member of the etching chamber is consumed to generate a metal or the like (for example, Al) which in turn is deposited on the interior of the chamber, removal of the deposited metal is difficult to achieve through cleaning based on plasma only and therefore, a technique has been studied in which the atmosphere inside the chamber can be kept constant in advance or preparatorily by using seasoning, for example. As an example of this type of technique, a technique described in JP-A-2004-031380 (Patent Document 1) has been known.

Also, a technique described in U.S. Pat. No. 7,204,913 (Patent Document 2) has been known according to which coating is applied to the inner wall of a reactor each time that a wafer process proceeds with the aim of decreasing an influence the change in status of the reactor inner wall has upon the process performance.

On the other hand, as described in Journal of Vacuum Science and Technology B24, 2191(2006) (Non-Patent Document 2), it has been known that when a metal material (for example, TiN) is etched, the metal is deposited on the chamber inner wall and complete cleaning will sometimes be difficult to achieve in the gas system.

SUMMARY OF THE INVENTION

The aforementioned related arts, however, fail to take into full consideration the problems as below.

More particularly, in Patent Document 1, there is a possibility that a substance and particles responsible for the particles will be freed from a coated film per se, resulting in generation of particles and therefore, the condition of coating the film needs to be optimized. In the related arts, however, the condition as above is not taken into account.

Further, as the integration degree of a semiconductor integrated circuit increases, changes in CD are required to be suppressed for long time but when, in the case of processing a film of metal material (generally called a metal treatment) as described in Non-Patent Document 2, the material or its compound is deposited on the inner wall surface of processing chamber to be left behind, the process performance will possibly be changed by the residual metal material in the succeeding process executed in the processing chamber. As the process performance changes, the result of processing the process objective film such as a semiconductor wafer is caused to change, with the result that as the number of sheets of wafers increases, the shape obtained as a result of processing, indicated by so-called CD (Critical Dimension), is also caused to change.

With a view to solving the problems as above, it is conceivable to perform, each time that a wafer is processed, a cleaning process for removing a residual substance or a process for suppressing a change in the process performance (for example, seasoning process). But when, in the actual mass-production field, such a specified process as above is carried out, there arises a problem that the overall throughput is degraded in the case of processing a given number of lots. This problematic point is looked over in the aforementioned related arts.

Accordingly, an object of the present invention is to provide a plasma processing apparatus or method which can reduce changes in the shape obtainable as a result of processing. The present invention also intends to provide a plasma processing apparatus or method which can improve the efficiency of processing to raise the throughput.

To accomplish the above objects according to the present invention, in a plasma processing apparatus comprising a processing chamber arranged in a vacuum chamber, a sample stage arranged under the processing chamber and having its top surface on which a wafer to be processed is mounted, a vacuum decompression unit for evacuating the interior of the processing chamber to reduce the pressure therein and introduction holes arranged above the sample stage to admit process gas to the processing chamber, the wafer having its top surface mounted with a film structure and the film structure being etched by using plasma formed by using the process gas, and a plasma processing method using the plasma processing apparatus, the film structure is constituted by having a resist film or a mask film, a poly-silicon film and an insulation film laminated in this order on a substrate and before the wafer is mounted on the sample stage and the poly-silicon film underlying the mask film is etched, plasma is formed inside the processing chamber to cover the surface of members inside the processing chamber with a coating film containing a component of Si.

Preferably, in the step of covering the coating film, a gas containing a component of at least one of Si or Si and O and Si and C is supplied to the interior of the processing chamber.

Also preferably, after, following the step of covering the coating film, an aftertreatment process for forming plasma inside the processing chamber is carried out to process the surface of the coating film, the wafer is located inside the processing chamber and then an etching process is executed.

Also preferably, the film structure has a metal film made of a metal material and interposed between the poly-silicon film and the insulation film and a cleaning process for forming plasma adapted to eliminate the metal material from the coating film is carried out.

Other objects, features and advantages of the invention will become apparent from the following description of the embodiments of the invention taken in conjunction with the accompanying drawings.

BRIEF DESCRIPTION OF THE DRAWINGS

FIG. 9 is a graph showing changes in counts of particles freed from the surface of the coating film when the time to perform an aftertreatment is changed.

FIG. 10 is a flowchart showing a flow of semiconductor wafer processing carried out in the plasma processing apparatus according to the present embodiment.

DESCRIPTION OF THE EMBODIMENTS

Embodiments of the present invention will now be described with reference to the accompanying drawings.

Embodiment 1

Embodiment 1 of the invention will now be described by making reference to FIGS. 1 to 10.

Figure 1:
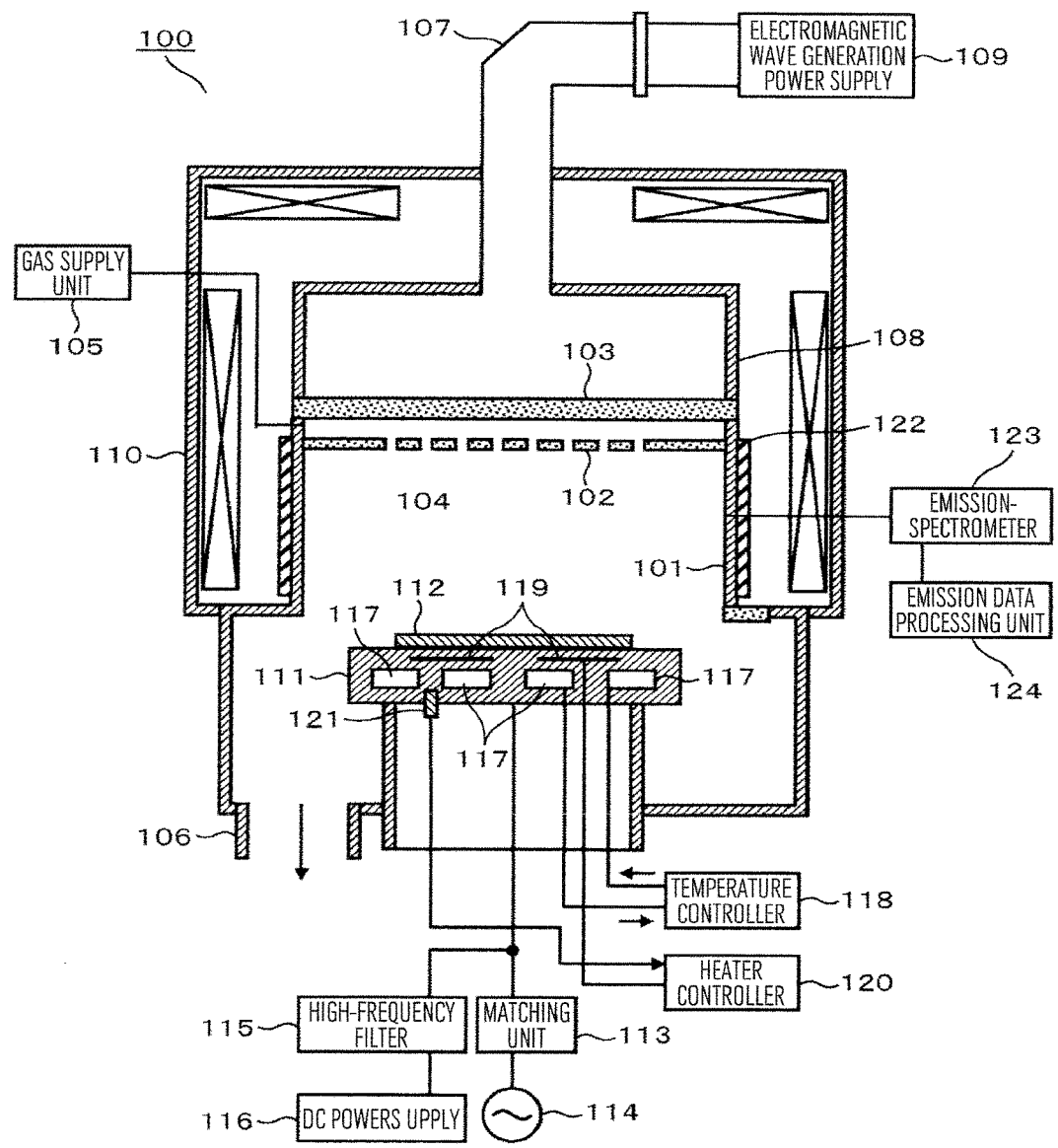
FIG. 1 is a longitudinal sectional diagram for explaining the schematic construction of a plasma processing apparatus according to an embodiment of the invention.

Reference will first be made to FIG. 1 showing a longitudinal sectional diagram for explaining the schematic construction of a plasma processing apparatus according to the present embodiment of the invention. Especially, in the present embodiment, an etching unit using microwave ECR (Electron Cyclotron Resonance) will be described.

In the plasma processing apparatus according to the present embodiment as shown in the figure, a shower plate 102 (for example, made of quartz or yttria) of circular disk form having a plurality of introduction holes arranged uniformly about a central portion and adapted to admit an etching gas to the interior of a vacuum chamber 101 and a dielectric window 103 (for example, made of quartz) are disposed at an upper portion of the vacuum chamber 101 opened upwards and the interior of a processing chamber 104 inside the vacuum chamber 101 and having a substantially cylindrical shape is hermetically sealed by means of the dielectric window 103. The shower plate 102 is in communication with a gas supply unit 105 for flowing the etching gas, the gas supply unit 105 connects to a space between the shower plate 102 and the dielectric window 103 thereabove by way of a pipe and a channel and the gas for processing is supplied to the interior of processing chamber 104 via the space and the introduction holes.

Further, under the vacuum chamber 101, a vacuum pump unit (not shown) is arranged to communicate with the bottom of the substantially cylindrical space of processing chamber 104 inside the vacuum chamber 101 through a vacuum evacuation opening 106. On the other hand, in order to transmit to the processing chamber 104 the electric power for generation of plasma, a waveguide 107 (or antenna) for radiating an electromagnetic wave is disposed above the dielectric window 103.

The electromagnetic wave transmitted to the waveguide 107 (or antenna) is oscillated with the help of an electromagnetic wave generation power source 109 and fed to the interior of waveguide 107. In the present embodiment, the frequency of the electromagnetic wave is not particularly limited and exemplarily, a microwave at 2.45 GHz is used.

A magnetic field generation solenoid coil 110 for forming a magnetic field is disposed exteriorly of the vacuum chamber 101, surrounding the outer periphery of processing chamber 104, and the electric field oscillated by the electromagnetic wave generation power source 109 and admitted to the interior of processing chamber 104 via the waveguide 107, dielectric window 103 and shower plate 102 interacts with the magnetic field formed by the magnetic field generation solenoid coil 110 to dissociate the process gas fed to the interior of processing chamber 104, thereby generating plasma inside the processing chamber 104. Further, at a lower portion of the interior of processing chamber 104, a wafer mount electrode 111 is arranged opposing the disk-shaped shower plate 102, the wafer amount electrode 111 corresponding to a sample stage having its circular top surface on which a disk-shaped semiconductor wafer 112 representing a member to be processed is mounted.

The wafer mount electrode 111 is substantially cylindrical, having its electrode top surface covered with a flame-coating film (not shown) formed by flame-coating a ceramic material such as aluminum oxide or yttrium oxide to the electrode top surface. Then, disposed in the flame-coating film is an electrode film (not shown) made of a metal material which in turn is connected electrically to a DC power supply 116 via a high-frequency filter 115.

Further, a metal block of the wafer mount electrode is connected with a high-frequency electromagnetic power supply 114 via a matching circuit 113 and this block operates as a high-frequency electrode. Formed in the metal block of wafer mount electrode 111 is a concentric or spiral coolant conduit 117 which passes flow of a medium for controlling temperatures inside the block and the coolant conduit 117 is coupled to a temperature controller 118 via pipes laid exteriorly of the wafer mount electrode 111.

Further, a heater 119 is disposed in the electrode block and connected to a heater controller 120. A temperature sensor 121 is provided for the wafer mount electrode 111 and operation of the heater controller 120 and the temperature controller 118 for control of coolant temperature is adjusted on the basis of a signal outputted from the temperature sensor 121 so as to set temperatures of the wafer mount electrode 111 and the wafer 112 to desired values.

The wafer 112 is transferred to the interior of processing chamber 104 with the help of a transfer unit (not shown) such as a robot arm and mounted on the top surface of wafer mount electrode 111 and thereafter, adsorbed to the flame-coating film on the wafer mount electrode 111 under the influence of electrostatic force of DC voltage applied from the DC power supply 116. In this phase, a gas having the heat transfer capability is supplied to a space between the rear surface of wafer 112 and the flame-coating film to expedite transfer of heat between the wafer 112 and the wafer mount electrode 111, so that the temperature of the wafer 112 can be adjusted.

Under this condition, a desired process gas, an etching gas in this case, is supplied by means of the gas supply unit 105 and thereafter, plasma is generated while setting the pressure inside the processing chamber to a predetermined value. Subsequently, the high-frequency electromagnetic power is applied from the high-frequency electromagnetic power supply 114 connected to the wafer mount electrode 111 to set up bias potential above the flame-coating film, so that ions are attracted from plasma to the wafer so as to apply an etching process to the wafer 112.

An emission-spectrometer 123 for detecting the emission during the plasma processing is connected to the side-wall of vacuum chamber 101 constituting the inner wall of processing chamber 104 and then, an output obtained from the emission-spectrometer 123 is transmitted to an emission data processing unit 124 connected thereto and analysis and detection of numerical values of emission data is carried out by using a calculator inside the emission data processing unit 124.

Figure 2A:
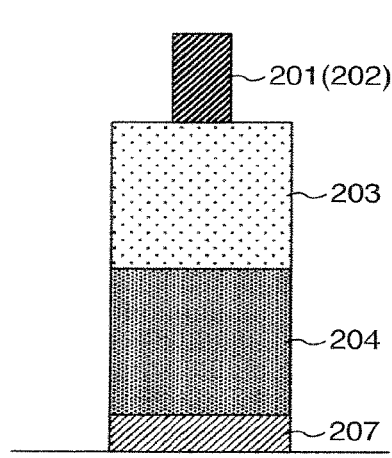
FIGS. 2A and 2B are longitudinal sectional views diagrammatically illustrating film structures located on the top surface of a semiconductor wafer representing a member to be processed in the plasma processing apparatus according to the embodiment shown in FIG. 1.
Figure 2B:
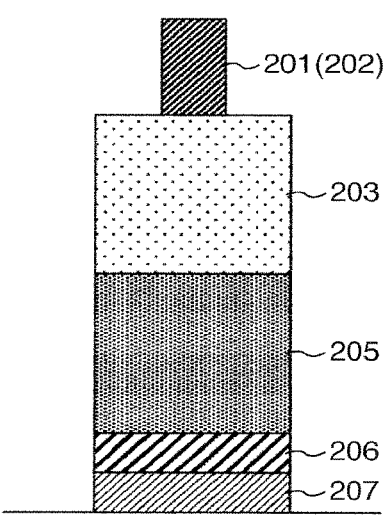

Turning to FIGS. 2A and 2B, structures of the film laid on the top surface of the semiconductor wafer representing the member to be processed by the plasma processing apparatus in the present embodiment are illustrated diagrammatically in longitudinal sectional form. A film structure for the process objective member as shown in FIG. 2A includes a substrate 207 constituting an undercoating material and components laminated on the substrate from top to bottom in this order, that is, a resist (photo-resist, PR) mask 201 or a hard mask (a film using a material such as $SiO_2$, SiN or SiON or containing it as a principal material) 202, a poly-silicon (Poly-Si) film 203 and an oxide film 204 serving as an insulation film. Another film structure as shown in FIG. 2B includes a substrate 207 and components laminated on the substrate from top to bottom in this order, that is, a resist (photo-resist, PR) mask 201 or a hard mask (a film using a material such as $SiO_2$, SiN or SiON or containing it as a principal material) 202, a poly-silicon (Poly-Si) film 203, a metal (for example, TiN) film 205 and a film (High-K film) 206 made of High-k material (for example, $HfO_2$).

The kind of metal material, the number of stacking and the thickness differ depending on a device, an NMOS portion and a PMOS portion. With the aim of forming a circuit of a semiconductor device, especially, a gate structure and a wiring structure, the aforementioned film structures are required to be processed by etching so as to be worked into a predetermined shape.

In the present embodiment, the respective films are processed according to different etching recipe. Further, the mask portion is not limited to the resist film 201 used conventionally and made of an organic material but in consideration of the fact that only the mask is insufficient for its film thickness corresponding to recent fine working and for its etching resistant capability, the hard mask 202 made of a material such as amorphous carbon (ACL), SiN or SiON or a mixture thereof underlying the resist film 201 is adopted, providing a laminated structure. With the hard mask 202, the underlying Poly-Si and metal material can be etched. Here, the etching process with the mask 202 will not be described.

In the present embodiment, for etching the poly-silicon film 203, either a mixture gas of a gas containing chloride (Cl) as a component (chloride system gas, for example, $Cl_2$) and a gas containing fluorine (F) as a component (fluorine system gas, for example, $CF_4$) or a mixture gas of $Cl_2$ and HBr is used as at least part of the etching gas. As necessary, a gas of $O_2$, for example, may also be used.

Next, in the etching process for the metal (for example, TiN) film 205 of the film structure shown in FIG. 2B, ions of high ion energy are bombarded by raising a relatively high wafer bias in order to first eliminate, for example, a naturally oxidized film formed at a metal layer interface and the naturally oxidized film is removed by the effect of sputtering principally. The process gas used in this case is that containing HBr or Ar but a different gas system may be adopted.

After the naturally oxidized film has been eliminated, a gas of $Cl_2$ or a mixture gas of $Cl_2$ and Hbr is principally used as the process gas for etching the metal film 205. Since the metal film 205 in the present embodiment is a thin film, the etching is carried out while adjusting the wafer bias such that relatively low ion energy can prevail.

Next, etching of the High-K (for example, $HfO_2$) film 206 made of a high dielectric constant material is carried out while using a $BCl_3$ gas or a mixture gas of $BCl_3$ and $Cl_2$ as the process gas. In this step, by using the relatively low ion energy condition, excellent etching characteristics (etch profile and selectivity) can be attained.

Next, by making reference to FIGS. 3 to 10, details of processing a wafer representing a member to be processed according to the first embodiment of the invention will be described. A process of etching the film structure as shown in FIG. 2A will be described herein but the same effects can be obtained with the film structure as shown in FIG. 2B.

In the present embodiment, when the material $SiO_2$, SiN or the like is used for the mask 201 in etching the film structure shown in FIG. 2A, either a gas containing a component of $CxHyFz$ (x, y, z=0, 1, 2, ...) or a mixture gas of this kind of gas, a gas for dilution and oxygen is used for the etching. For the poly-silicon film 203, either a mixture gas of a chloride (Cl) system gas (for example, $Cl_2$) and a fluorine (F) system gas (for example, $CF_4$) or a mixture gas of $Cl_2$ and HBr is used as described previously. As necessary, a gas of $O_2$, for example, may also be used.

For the purpose of measuring matters deposited on the inner wall of processing chamber 104 after completing the individual steps of etching, the present inventors located a sample simulating the processing chamber inner wall of the processing chamber 104 and measured the chemical composition deposited film on the sample through XPS (X-ray photoelectron spectroscopy). The inner wall of the processing chamber 104 used in the present experiment is made of quartz but especially, because quartz resembles a composition of a reaction product generated in the course of etching the poly-silicon film 203, $Al_2O_3$ is used for the sample in order to discriminate the reaction product from the material of the member constituting the inner wall.

In the experiment, as the process gas, a gas containing $CHF_3/SF_6$ is used for the step of etching the mask 202, a gas containing $Cl_2/CF_4/Ar$ is used for the step of etching the poly-silicon film 203, that is, Poly-BT (Break-Through) step and a gas containing $Cl_2/HBr/O_2$ is used for Poly-Endpoint and Poly-OE (Over-Etching) steps.

Figure 3:
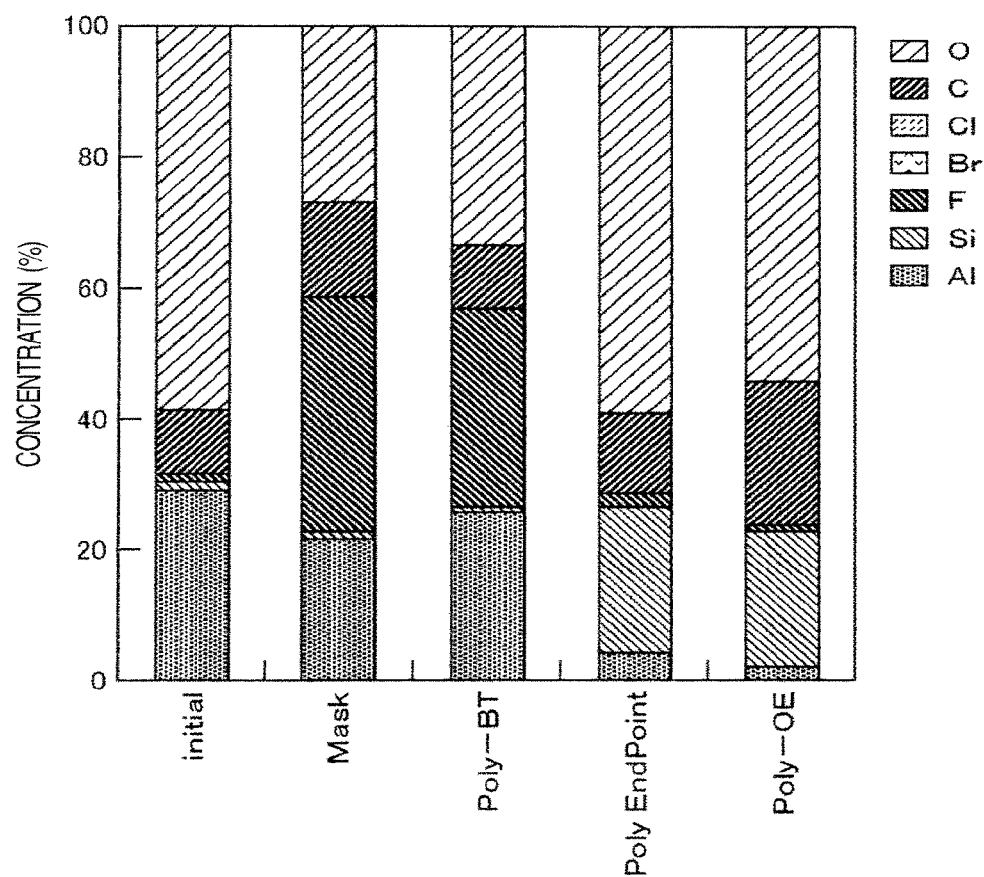
FIG. 3 is a graph showing composition ratios of deposited elements when the film structure of FIG. 2A is processed.

After processing in the individual processes being completed, elements having composition ratios as shown in FIG. 3 are detected from the sample. Illustrated in FIG. 3 is a graph showing composition ratios of elements of the deposited film obtained when the film structure of FIG. 2A is processed.

As shown in the figure, principal components of the deposited film formed on the inner wall of processing chamber 104 throughout mask 202 step to Poly-BT step are C and F and since from a Cls spectrum, though not illustrated, a peak is seen on higher energy side than C—C bond, CFx (x=1, 2, 3) is considered as a principal component. Further, throughout Poly-EndPoint step to Poly-OE step, Si and O are principal components of the deposited film and in a Si2 p spectrum, a peak existing near 103 eV is seen and formation of a SiOx film can be estimated.

Figure 4:
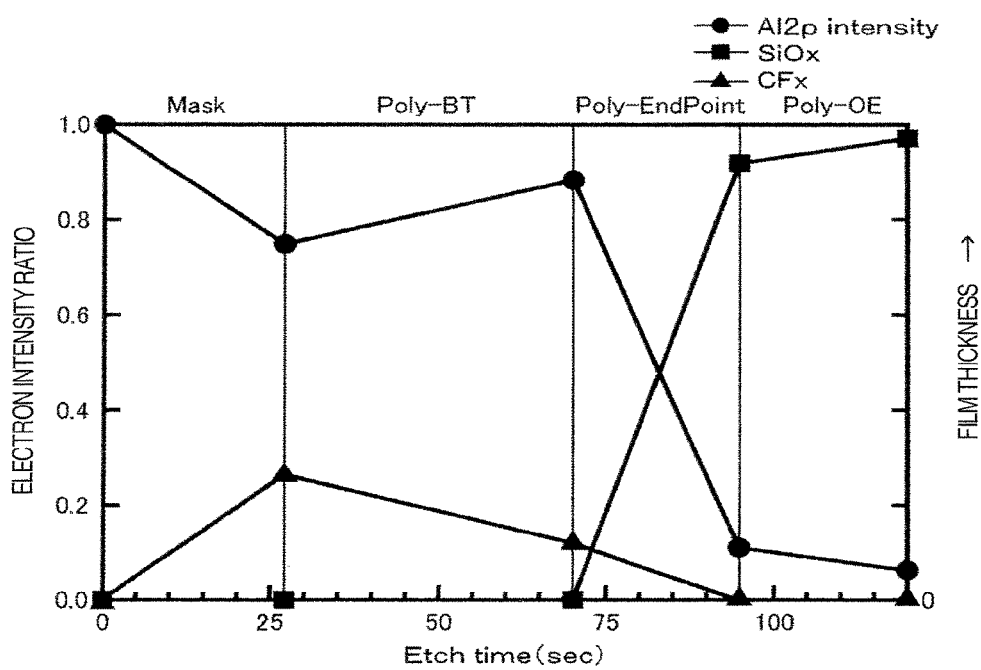
FIG. 4 is a graphic representation showing changes in thickness of films deposited on the inner wall surface of the processing chamber after completion of etching the film structure shown in FIG. 2A or 2B.

Also in the present experiment, intensities of electrons obtained from Al of the sample surface ($Al_2O_3$) are measured and densities of CFx and SiOx of deposition films are assumed to be predetermined values, thus making it possible to determine the film thickness of the deposited film in the individual steps. On the assumption that SiOx is $SiO_2$ and CFx resembles FTFE (Poly-tetra-fluoro-ethylene) having a density of 2.2 g/$cm^3$, film thicknesses are illustrated in FIG. 4. It will be seen that throughout mask step 201 to Poly-BT step, a CFx film is formed and throughout Poly-EndPoint step to Poly-OE step, a SiOx film is formed but during etching initiation and steps (Poly-BT and Poly-EndPoint) for switchover of CFx film to SiOx film, the film once formed on the wall disappears. In other words, the wall surface of processing chamber 104 exposes during this interval, in which if the condition of the inner wall of processing chamber 104 changes with time, the wall surface is said to be susceptive to the change of condition.

The change in the condition of the inner wall of processing chamber 104 has influence on characteristics and results of process of the wafer 112, causing them to change and so, for the sake of suppressing their change, the inner wall surface of processing chamber 104 facing plasma may conceivably be coated with a coating film of a predetermined material. In applying etching to the film of the aforementioned structure, the kind of etching gas system to be used differs according to the kind of the film and in some case, the film deposited on the inner wall of processing chamber 104 will disappear as in the aforementioned example and the inner wall will possibly expose. For these reasons, a film covering the inner surface of the processing chamber 104 (hereinafter termed a coating film) is desirably such that in etching the plural films of the aforementioned film structure, the coating film remains on the inner surface of processing chamber 104 until the etching process of a target film ends or at least during the step of switchover of the film.

Accordingly, in the present embodiment, a film thickness in excess of the film thickness consumable during etching process is deposited in advance. Further, since, in the process of etching the aforementioned film structure, plasma formed by supplying, as the process gas, a fluorine (F) gas system and a chloride (Cl) gas system is used, the coating film needs to have high plasma resistant capability against the plasma of this kind.

Figure 5:
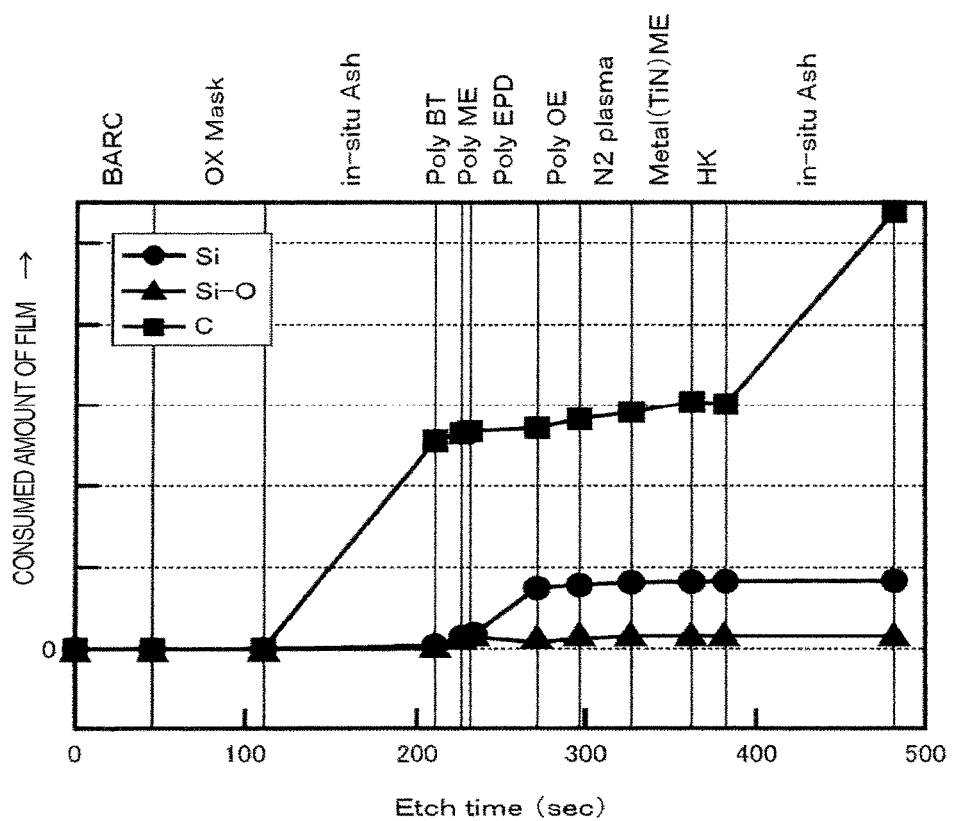
FIG. 5 is a graphic representation showing amounts of consumption of respective coating films as a process of etching the film structure shown in FIG. 2B proceeds, in case where a (Si system) film containing a component of Si, a (C system) film containing a component of carbon and a (SiO system) film containing a component of SiO are coated on the wall surface inside the processing chamber.

When, in etching the film structure as shown in FIG. 2B, a film containing a component of Si (Si system film) and a film containing a component of SiO (SiO system film) are coated on the inner wall surface of processing chamber 104, the individual coating films are consumed by amounts as illustrated in a graph of FIG. 5. In the figure, a coating film principally containing carbon (C) is consumed by a large amount in a step in which oxygen is used (for example, in-situ Ash step), being considered as having low plasma resistant capability. On the other hand, the coating film of Si or SiO system is suppressed to relatively small consumption amounts, being considered as having high plasma resistant capability, and the present inventors determined that the Si or SiO system film is suitable as the coating film.

Especially, in the case of the coating film containing Si, a film containing Si and oxygen (O) and a film containing Si and carbon (C) have each good plasma resistant capability. As the kind of gas of process gas for forming plasma adapted to deposit the aforementioned coating film on the surface of members inside the processing chamber 104, either a mixture gas of $SiCl_4$ and $O_2$ or a mixture gas of $SiCl_4$ and methane ($CH_4$), for example, is preferable. By adding a gas for dilution such as Ar, a similar coating film can also be formed.

Figure 6:
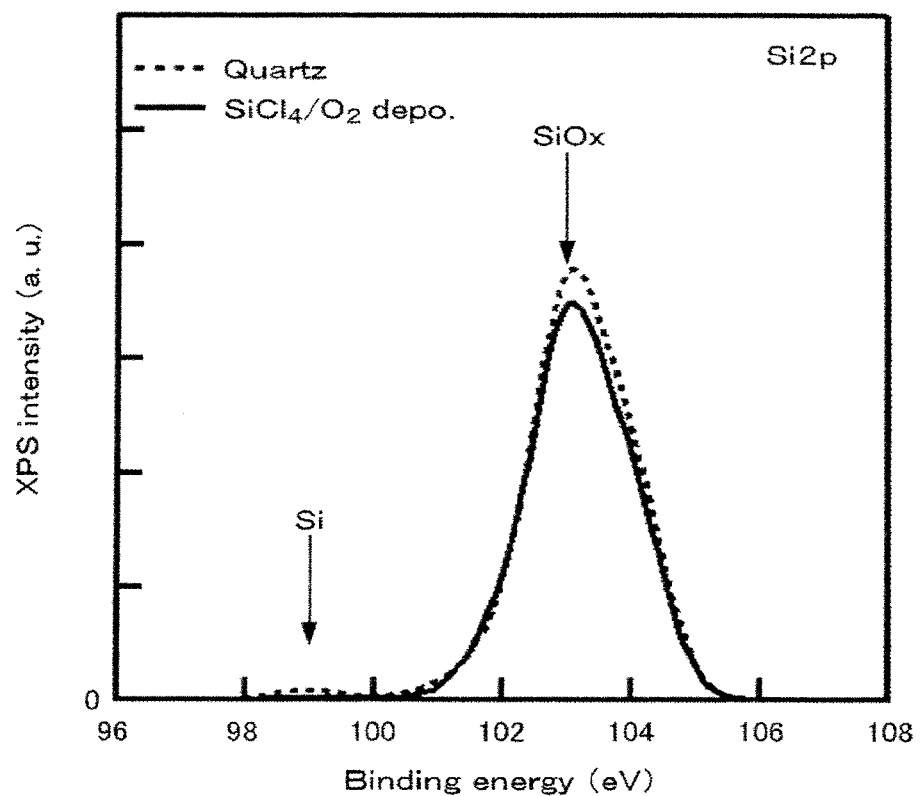
FIG. 6 is a graph showing a Si2p spectrum coming up when the surface of the coating film formed by using a mixture gas of $SiCl_4$ and $O_2$ is measured through XPS.

The surface of the coating film formed by using the mixture gas of $SiCl_4$ and $O_2$ is measured through XPS to obtain a Si2p spectrum as shown in a graph of FIG. 6. In the figure, results of analysis of the surface of quartz are illustrated concomitantly. In both the coating film and the quartz, a peak develops near substantially the same bonding energy, that is, 103 eV, proving that an oxide film ($SiO_2$) is formed.

Figure 7:
FIG. 7 is a diagram showing an image obtained by measuring the coating film surface through SEM (Scanning electron microscopy).

Illustrated in FIG. 7 is an image obtained by measuring the coating film surface through SEM (Scanning electron microscopy). As the flow rate ratio of $O_2/SiCl_4$ falls below 0.5, roughness takes place on the surface of the coating film. The presence of this kind of roughness on the surface of coating film will generate particles due to generation of a crack originating from the roughness. Therefore, in the present embodiment, in the process gas admitted to the interior of processing chamber 104 for forming coating films, the flow rate ratio between $O_2$ and $SiCl_4$ is set to 0.5 or more.

The wafer 112 mount surface on the top of wafer mount electrode 111 is covered with the spray coating film but when the wafer 112 is not mounted during the plasma process for formation of the coating film, the coating film is similarly formed on the mount surface. Consequently, while the wafer 112 is mounted on the wafer mount electrode 111 and a predetermined film of the film structure to be processed undergoes an etching process, the coating film exists between the ESC film (spray coating film) and the wafer.

Studies by the present inventors show that on the surface of the coating film immediately after being formed on the spray coating film in this phase, the distribution of unevenness and surface roughness attributable to minute raised portions becomes non-uniform. For example, a knowledge has been given of the fact that such a raised portion is a projection due to a material containing Si. Then, when voltage is applied to the thin-film electrode for electrostatic adsorption located inside the spray coating film and force is applied to the coating film between the wafer and the spray coating film, the aforementioned unevenness and roughness causes a crack to generate in the coating film which originates from the minute roughness and it leads to increase of the number of particles.

Then, not only the above problem is involved in the coating film on the surface of the wafer mount electrode 111 but also there is a possibility that the problem will arise similarly in the film covering the surface of a member arranged inside the processing chamber 104. For example, when, following formation of the coating film, a wafer 112 for product is processed through etching by forming plasma inside the processing chamber 104, charged particles and reactive particles in the plasma interact with the material constituting the coating film, with the result that cracks and damages are caused and besides, possibly, liberated fragments cause contamination and the particles to develop as in the case described previously.

Figure 8A:
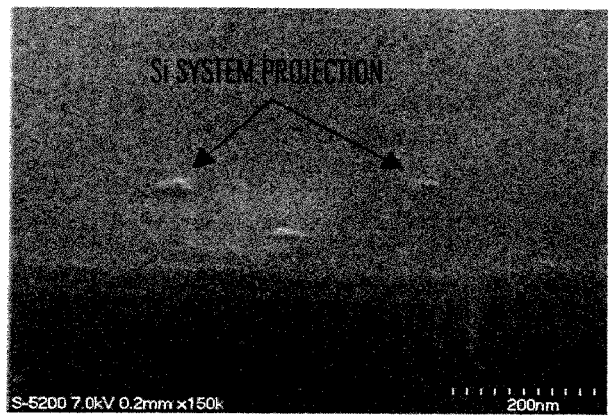
FIGS. 8A and 8B are diagrams showing images similar to the image in FIG. 7.
Figure 8B:
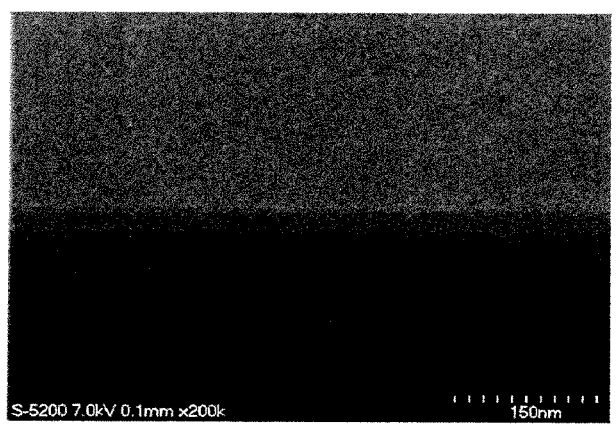

With the particles deposited on the wafer, the yield of product will possibly be degraded. In the present embodiment, in order to suppress the above problem from occurring, after a coating film is formed in the processing chamber 104 by plasma processing as described previously without mounting a wafer 112 on the top surface of wafer mount electrode 111, the surface treatment for reducing the projection, unevenness and roughness is carried out. In the present embodiment, the surface treatment is carried out by applying predetermined etching to the coating film surface with the help of plasma. Thus, after the coating film which is resistant against the plasma for etching process has been deposited, an aftertreatment of the coating film is carried out in order that roughness, projection and unevenness on the surface of the coating film can be reduced as shown in FIG. 8B and generation of the particles can be suppressed.

Conditionally, for applying the above aftertreatment to the coating film following formation thereof, a process based on plasma is effective which uses a (F system) gas containing a component of fluorine, for example, $SF_6$. As the time to perform the aftertreatment changes, the number of particles liberated from the surface of the coating film changes as shown in FIG. 9.

As shown in the figure, the number of particles decreases steeply until the time to continue the aftertreatment using the plasma reaches about 2 seconds and after the lapse of about 2 seconds, the number of particles gradually approaches 0. With this knowledge in mind, the inventors have thought of suppression of generation of the particles by reducing roughness and defects on the surface of the coating film through an aftertreatment using plasma for about 2 seconds or more. In other words, through the aftertreatment, the roughness and defects on the surface can be reduced by using plasma after the process for forming the coating film inside the processing chamber 104.

Turning now to FIG. 10, there is illustrated a flowchart showing a flow of procedures for processing a semiconductor wafer carried out in the plasma processing apparatus according to the present embodiment. In the figure, an example is shown in which a predetermined number of wafers stored in a container capable of housing wafers such as a cassette are handled as one lot and in respect of each lot, processing is started from an aging process (step 1001) for placing the surface of members arranged in the processing chamber 104 inside plasma processing apparatus 100 in condition suitable for processing.

In the aging process, plasma is formed by admitting a predetermined gas, for example, such an inert gas as Ar under the condition that a process objective wafer 112 is not located in the processing chamber 104 in order that temperature can be adjusted so as to be placed in condition suitable for a process for the wafer 112 to be performed subsequently. Thereafter, a gas for cleaning is admitted to the interior of processing chamber 104 and plasma is formed so that a cleaning process is performed for eliminating particles, coatings and deposited by products and remaining on the inner surface of processing chamber 104 (step 1002).

A coating process (step 1003) is carried out for covering the inner surface of processing chamber 104 placed in clean condition through the cleaning process with a coating film adapted to stabilize characteristics of the etching process. In the coating process in the present embodiment, as the kind of gas of process gas for forming plasma necessary to deposit a coating film on the surface of members inside the processing chamber 104, either a mixture gas of $SiCl_4$ and $O_2$ or a mixture gas of $SiCl_4$ and methane ($CH_4$), for example, is used and supplied along with Ar gas for dilution to perform the coating process, as described previously. By forming plasma by use of the gas as above, the surface of members arranged in the interior of processing chamber 104, for example, the surface of inner-side wall of processing chamber 104, the top surface and side surface of wafer mount electrode 111 are covered with a coating film made of a material containing Si or SiO.

The coating process (step 1003) is carried out under the condition that the wafer 112 for fabrication of product to be processed is not mounted on the mount surface on the top of wafer mount electrode 111. Thereafter, the gas to be introduced is exchanged with, for example, $SF_6$ which in turn is admitted to the processing chamber 104, thus forming plasma. With this plasma, an etching process (step 1004) is carried out which impersonates an aftertreatment for reducing roughness and defects on the surface of the coating film formed in the preceding step.

After the step 1004, the process gas is exchanged and the wafer 112 is transferred to the interior of chamber 104 and then mounted on the mount surface of wafer mount electrode 111 (step 1005). The interior of processing chamber 104 is sealed hermetically with the help of the gate valve, not shown, and thereafter, a process gas suitable for a film to be processed is admitted and the film structure as shown in FIG. 2A is subjected to an etching process (step 1006).

With the process for the film structure on the surface of wafer 112 finished, the wafer 112 is transferred to the outside of the processing chamber 102 (step 1007) and subsequently, a controller not shown of plasma processing apparatus 100 acquires information as to whether a wafer 112 to be processed is present or not via a communication means, deciding whether or not the process in the processing chamber 104 is to continue (step 1008). Then, if the presence of a wafer 112 to be processed next is determined, the program returns to the step 1002 in which deposits, films, residual particles and coating films inclusive are cleaned.

If the absence of a wafer 112 to be processed is determined, the program proceeds to step 1009 in which as in the step 1002, the interior of processing chamber 104 is washed and the process for wafer 112 ends (step 1010). To add, even with the process inside the processing chamber 104 ended, the processed wafer 112 will sometimes be on the way of transfer and therefore, when the controller determines that the wafer 112 is housed at the original position in the original cassette, it causes a reporting means such as a display monitor, buzzer or light provided for the plasma processing apparatus 100 to report the end of process.

By applying the processes shown in the present embodiment, it is possible to suppress the adverse influence caused by the fact that as the number of wafers to be processed increases or the process proceeds, the status of the inner wall of processing chamber 104 changes with time, the adverse influence being exemplified by the generation of the particles from the inner wall of processing chamber 104, the reduction in uniformity of the results of processing the wafer 112 or the change in characteristics such as processing rate or reproducibility of worked shape. Further, by performing the aftertreatment process following completion of formation of coating films, either the damage or the change in status of the surface of the coating film can be suppressed to thereby suppress either the generation of the particles or the influence on processing of wafer 112.

Thanks to the above beneficial effects, the reproducibility of etching process and the yield can be improved. While the present embodiment has been described by way of example of etching the film structure as shown in FIG. 2A, the invention involved in the present embodiment can also be applied to etching the film structure containing the metal film (for example, TiN) as shown in FIG. 2B, ensuring that through the cleaning process in the steps 1002 and 1009, a reaction product containing as a component a metal material remaining inside the processing chamber 104, for example, Ti can be eliminated together with the coating film and therefore a plasma process of high reproducibility can be achieved.

In the foregoing description of the embodiment, the process has been described in which the film structure shown in FIG. 2A devoid of the metal film 205 is etched to fabricate a semiconductor device. Next, the process for etching a process objective of the film structure as shown in FIG. 2B including the metal film 205 will be described. Equivalent portions to those in the foregoing embodiment will not be described.

Figure 11:
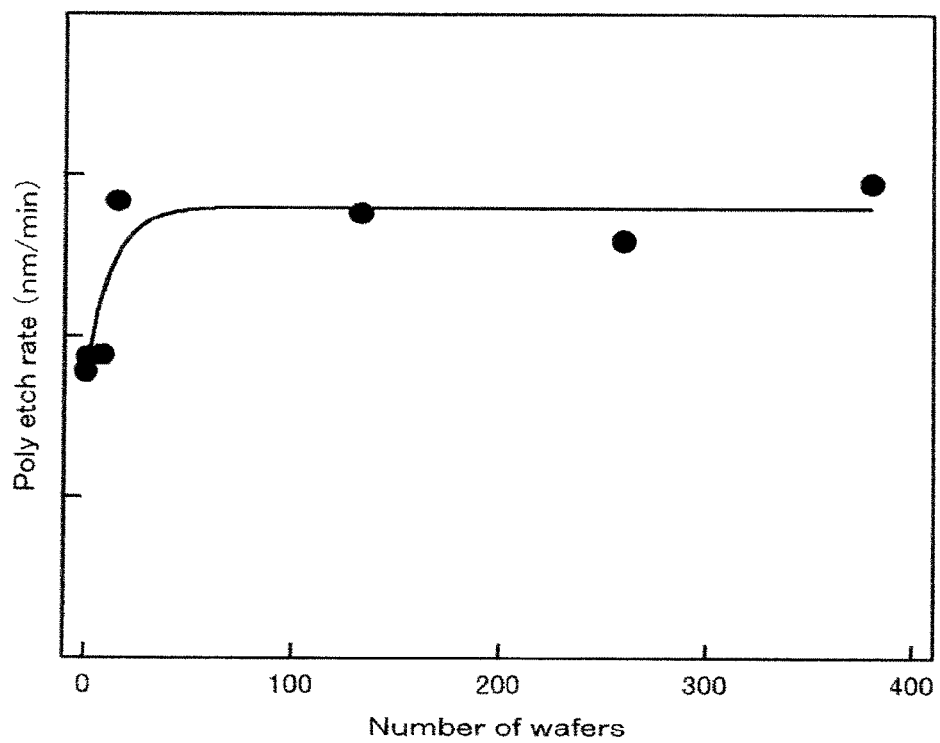
FIG. 11 is a graph showing changes in etching rate of a poly-silicon (Poly-Si) film when a wafer having its top surface provided with the film structure shown in FIG. 2B is processed after wet-washing according to the conventional technique.

Conventionally, in the technique of processing the film structure inclusive of the metal film 205 as shown in FIG. 2B, after practicing cleaning the surface of members inside the processing chamber 204 through, for example, wet-washing, then, with the aim of acclimating the interior of processing chamber 104 to a condition suitable for the succeeding etching process for wafer 112, a wafer having on its surface a film of, for example, Si or PR or and oxide film devoid of a metal film is located in the processing chamber 104 and plasma is formed to carry out the previously described seasoning process and thereafter, the wafer for product fabrication is processed.

Where plural wafers of a given lot each having on its top surface the film structure having the metal film/High-k film as shown in FIG. 2B are subjected to the wet-washing in accordance with the conventional technique as above and thereafter processed, the etching rate of the poly-silicon (Poly-Si) film changes as shown in a graph of FIG. 11. As will be seen from the figure, with the conventional technique, the etching rate increases abruptly in the very initial phase of starting processing the wafer and subsequently, the etching rate gradually approaches an arbitrary value and stabilizes.

The inventors have gained a knowledge that the cause of the above phenomenon resides in that a component (for example, Ti) of the metal film remaining in the processing chamber 104 adsorbs such components as fluorine (F) and chloride (Cl) and the like of a gas supplied to the interior of processing chamber 104 and as a result, the concentration of F and Cl increases during processing. Generally, bond of Ti—F and that of Ti—O are stable and are difficult to eliminate conventionally under the condition of the cleaning process using plasma. On the other hand, for suppressing the change in process, it has been conceived to perform Ti seasoning in which a wafer of the same kind as the metal material (for example, TiN) contained in the process objective member is processed and Ti is deposited inside the processing chamber 104, thus stabilizing the atmosphere inside the processing chamber.

Figure 12:
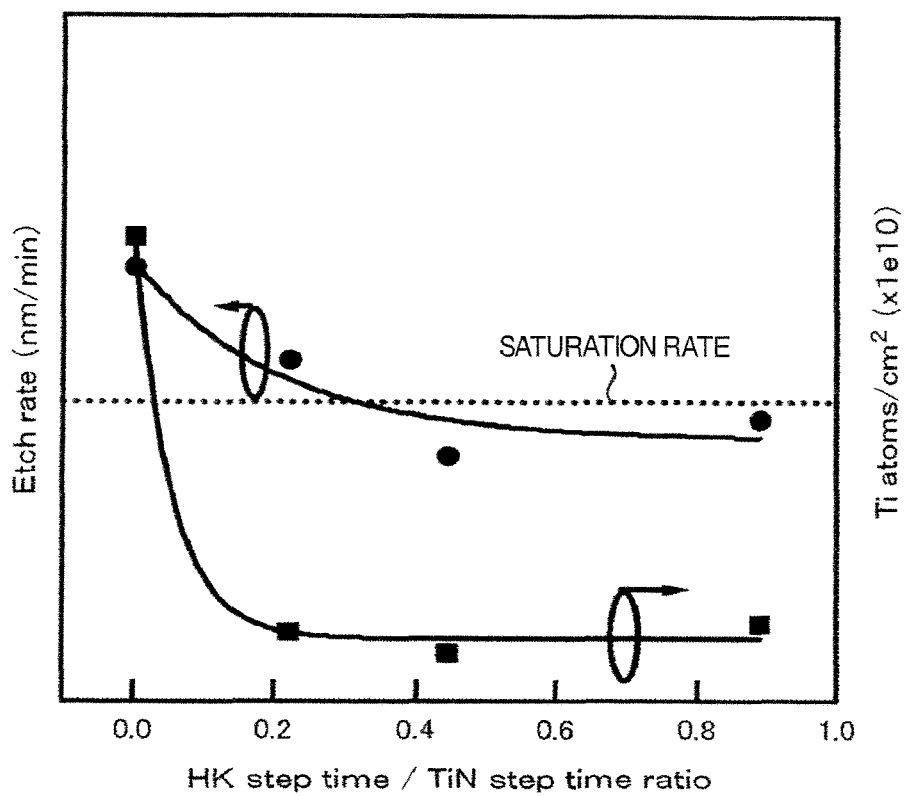
FIG. 12 is a graph showing changes in the etching rate of the poly-silicon (Poly-Si) film and changes in amounts of Ti remaining inside the chamber as the time to continue the processing changes.

Illustrated in FIG. 12 is a graph showing conditions for the step of etching the High-K film 206 and for the step of etching the metal (for example, TiN) film 205, that is, for example, how the etching rate of the poly-silicon (Poly-Si) film 203 and the amount of Ti remaining in the chamber change as the time to continue the process changes. In the figure, the Ti amount is determined by mounting a clean Si wafer on the wafer mount electrode 111 while keeping Ti left behind inside the processing chamber 104, supplying a gas of Ar for plasma formation to form plasma for sputtering the Ti remaining on the inner wall of processing chamber 104 and eventually measuring an amount of Ti deposited on the wafer through TXRF (Total reflection x-ray fluorescence).

As will be seen, the longer the time to perform the etching process for the High-K film 206 as compared to the time to perform the etching process for the metal (TiN) film 205, the more the etching rate of poly-silicon film 203 decreases and besides, as the ratio between these times exceeds a predetermined value, the etching rate gradually approaches an arbitrary value. Similarly, it has been found that the Ti amount remaining inside the processing chamber 104 also decreases as the ratio between times to perform the process for etching the High-K films 206 and the metal film 205 increases.

As described previously, Ti left behind inside the processing chamber 104 is assumed to remain in stable bond status such as Ti—F and Ti—O and therefore, in the step of performing the etching process for the High-K film 206, a gas containing a component of $BCl_3$ is used as the process gas. The inventors have thought that in this phase, B acts as reductant to make the bonds of Ti—O and Ti—F easily separable and hence, the residual Ti is eliminated.

Namely, in the process of etching the film structure of the present embodiment, the metal component (for example, Ti) of the metal film 205 is supplied to the interior of processing chamber 104 in the step of etching the metal film 205 whereas in the step of etching the High-K film, the metal component (for example, Ti) left behind inside the processing chamber 104 is eliminated. The thickness of the individual films differs depending on the structure of a semiconductor device to be fabricated and therefore, for the individual etching process times, the amounts of Ti remaining inside the processing chamber 104 differ according to semiconductor devices to be fabricated.

In the case of fabrication of a single semiconductor device only, characteristics of the etching process for fabrication of the semiconductor device can be stabilized by stabilizing the status of the inner wall surface of processing chamber 104 through, for example, the aforementioned seasoning process. In the case of fabricating a plurality of different devices at a time, however, it is necessary to carry out resetting the chamber condition (for example, wetting process) and perform seasoning in respect of individual products, raising a problem that the down time of the apparatus is prolonged and the throughput is decreased.

As described above, the metal, for example, the Ti system reaction product remains in the form of strong bonds of Ti—O and Ti—F and is therefore difficult to eliminate with the conventional plasma process using F system gas system alone. Accordingly, as described in connection with the above embodiment, before mounting the wafer 112 to be processed on the wafer mount electrode 111 inside the processing chamber 104, the plasma process for forming coating films on the inner wall of processing chamber 104 and on the flame-coating film formed on the top surface of wafer mount electrode 111 is applied and thereafter, the wafer 112 is mounted on the electrode, eventually performing the process of etching the film structure of wafer 112. Then, after completion of the etching process, the cleaning process for removing the coating films is carried out. In this phase, a substance deposited on the coating film and containing a component of the metal film 205, for example, a Ti system reaction product is eliminated together with the coating film. By performing the processes as above, a more stable plasma process can be achieved but depending on conditions of the process, the metal material such as a Ti system reaction product remains inside the processing chamber, giving rise to a problem that the residual substance has an influence on the succeeding etching process for the metal film 205 and the change in the process characteristics grows.

In the present embodiment, by adding the cleaning process after formation of the coating film, a metal cleaning step is provided for eliminating the component of the metal material remaining in the processing chamber 104. Timings for inserting the metal cleaning step are two and each case will be described below.

Figure 13:
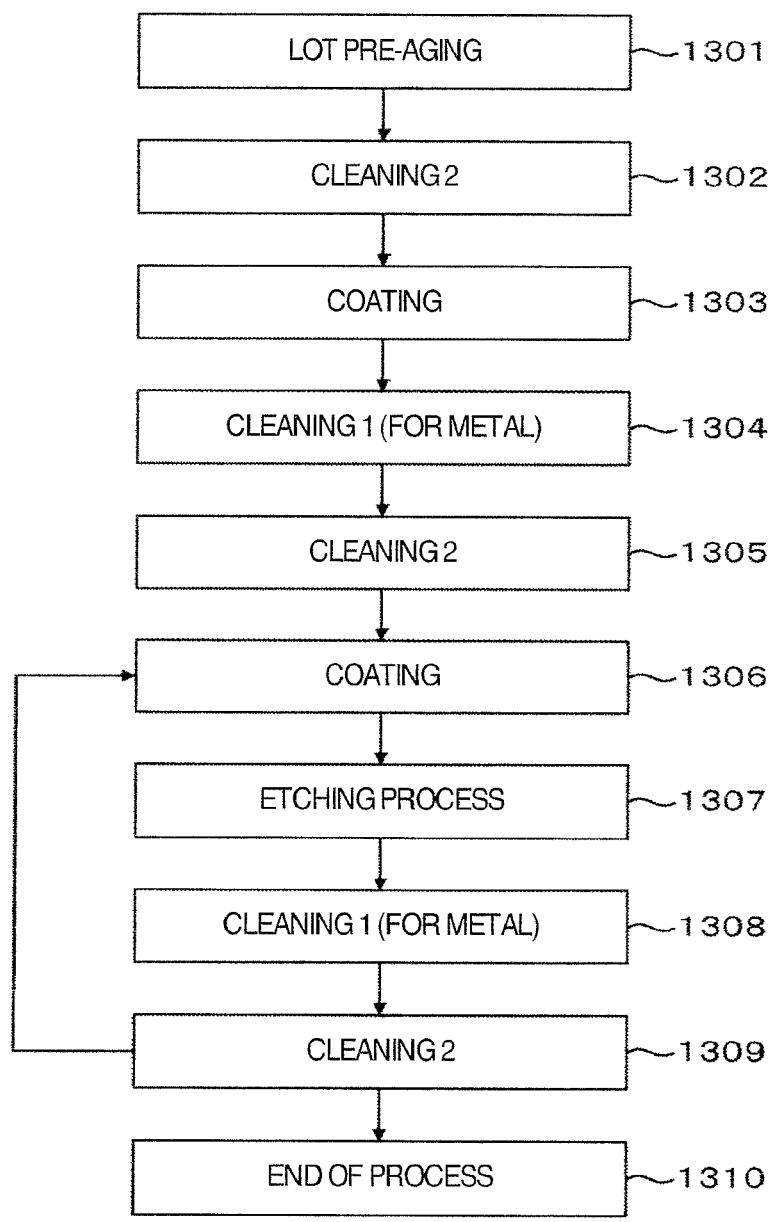
FIG. 13 is a flowchart showing a flow of process including a metal cleaning step in the plasma processing apparatus shown in FIG. 1.

A first case will be described with reference to FIG. 13. Illustrated in FIG. 13 is a flowchart showing a flow of procedures including the metal cleaning step in the plasma processing apparatus shown in FIG. 1. In the present embodiment, the process as above is exemplarily performed wafer by wafer but the process for the operation may be carried out every predetermined number of wafers.

Turning now to FIG. 13, there is illustrated a flow chart of operation flow when the processing chamber is heimetically sealed after periodical maintenance such as exchange of parts inside the processing chamber 104, followed by initiation of pressure reduction, and the plasma processing apparatus 100 is again operated or when a process for a new lot is initiated. In this example, a lot pre-aging process (that is, an aging process before the process for the new lot) is first carried out to arrange the chamber condition inside the processing chamber 104 (step 1301). Thereafter, a cleaning process for eliminating ordinary reaction products is carried out (step 1302). The cleaning is effected by using plasma formed inside the processing chamber 104 so as to eliminate remaining substances deposited/laminated on the inner wall surface of processing chamber 104.

The aging and cleaning processes are performed for purpose and under condition and operation equivalent to those dealt with in the steps 1001 and 1002 in FIG. 10. Through the cleaning process (step 1302), the metal component may also be eliminated.

Subsequently, through the process for formation of the coating film for purpose and under condition and operation equivalent to those in the step 1003 in FIG. 10, coating films are formed on the surface of members inside the processing chamber 104 and on the top and side surfaces of wafer mount electrode 111 (step 1303). Next, the process of metal cleaning for eliminating metal materials contained in the coating film and attributable to components of metal film 205 is carried out to eliminate metal left behind in the interior of processing chamber 104 (step 1304). Further, the ordinary cleaning process equivalent to that in the step 1302 is subsequently carried out to eliminate remaining coating films (step 1305) and thereafter, the wafer 112 is actually processed.

In the figure, before a processing objective wafer 112 is located in the processing chamber 104 and an etching process for the wafer 112 is started, a plasma process for depositing coating films on the inner wall of processing chamber 104 and on the wafer mount electrode 111 having the flame-coating film and an aftertreatment process are carried out (step 1306). Subsequently, the wafer 112 is mounted on the wafer mount electrode 111 and a process objective film structure as shown in FIG. 2B disposed on the wafer 112 is etched by realizing a predetermined condition (step 1307).

After the etching process applied to the process objective film on the wafer 112 is completed, the wafer 112 is transferred out of the processing chamber 104 and then, with the coating films formed in the step 1306 remaining on the surface of members inside the processing chamber 104 and on the surface of wafer mount electrode 111, a metal cleaning process is carried out for cleaning a component constituting the metal film 205 and remaining inside the processing chamber 104, for example, Ti (step 1308).

Since, as described previously, Ti is conceived as being often in the form of stable bonds of Ti—O, Ti—F and the like, either a gas containing boron (B), hydrogen (H), carbon (C) or silicon (Si) or a mixture gas containing the above components in combination is supplied as the process gas to the interior of processing chamber 104 in the metal cleaning process in the step 1308. Further, by forming plasma by supplying to the interior of processing chamber 104 any one of the above elements or a combination of these elements together with chloride (Cl) or fluorine (F), Ti left behind inside the processing chamber 104 can be eliminated.

As examples of the process gas used for metal cleaning process as above, either a gas containing HCl, $SiCl_4$, $BCl_3$ or $CH_4$ and $Cl_2$ or F or a mixture gas of $SF_6$, $CF_4$, CxHyFz can be conceivable. Especially, according to studies by the inventors, with either a mixture gas of $BCl_3$ and $Cl_2$ or a mixture gas of $SiCl_4$ and $Cl_2$, high Ti cleaning effect can be attained. Further, even with the aforementioned mixture gas diluted with a dilution gas as necessary, similar advantages can be attained.

Generally, the mount surface of wafer mount electrode 111 on which the wafer 112 is mounted is made of a ceramic material and for example, such a material as $Al_2O_3$ or $Y_2O_3$ is used in general. When the member made of such a ceramic material is exposed to plasma, ceramics interact with charged particles and reactive particles in the plasma and they are etched and consumed. In the present embodiment, the plasma process such as aftertreatment process and metal cleaning process can be carried out with the coating film deposited on the mount surface made of ceramics and therefore, damage of ceramics constituting the mount surface caused by plasma can be suppressed.

After the aforementioned metal cleaning process is performed until the amount of a substance of metal component which combines with the component of coating film or the component of the member of inner wall of processing chamber 104 decreases sufficiently, a cleaning process for eliminating other reaction products remaining on the coating film or inside the processing chamber is carried out (step 1309). When the coating film is made of a material containing Si, for example, and the plasma process for formation of the coating film (step 1306) is carried out by using either a mixture gas of $SiCl_4$ and $O_2$ or a mixture gas containing $SiCl_4$, $O_2$ and Ar, the cleaning process is performed for cleaning by using as the process gas either a gas containing fluorine (F) or a gas containing a component of fluorine (F) and oxygen (O) to form plasma.

Through this, cleaning of high cleaning effect can be achieved. For example, a gas of $SF_6$, a gas of $NF_3$ or a mixture gas of $SF_6$ or $NF_3$ and $O_2$ is preferable. After the cleaning process, it is decided whether another wafer 112 is to be processed or not and the program proceeds to step 1306 or 1310 in accordance with necessity/non-necessity of the process. In the step 1310, the absence of a wafer 112 to be processed next is determined and the process inside the processing chamber 104 ends.

By repeating the above plasma process, the surface status of the members inside the processing chamber 104 can be restored in respect of individual wafers and is adjusted so as to be suitable for the process and so, the process generating less amounts of the particles can be performed with high reproducibility. Then, by performing these processes, the unevenness of conditions of the interior of processing chamber 104 can be suppressed before and after the periodical maintenance such as cleaning of the interior of processing chamber 104 and exchange of parts and between successive lots as well and so the process of high reproducibility can be achieved.

Next, a second case will be described with reference to FIG. 14. In the figure, identical portions to those in the first case will not be described and only different portions will be described.

Figure 14:
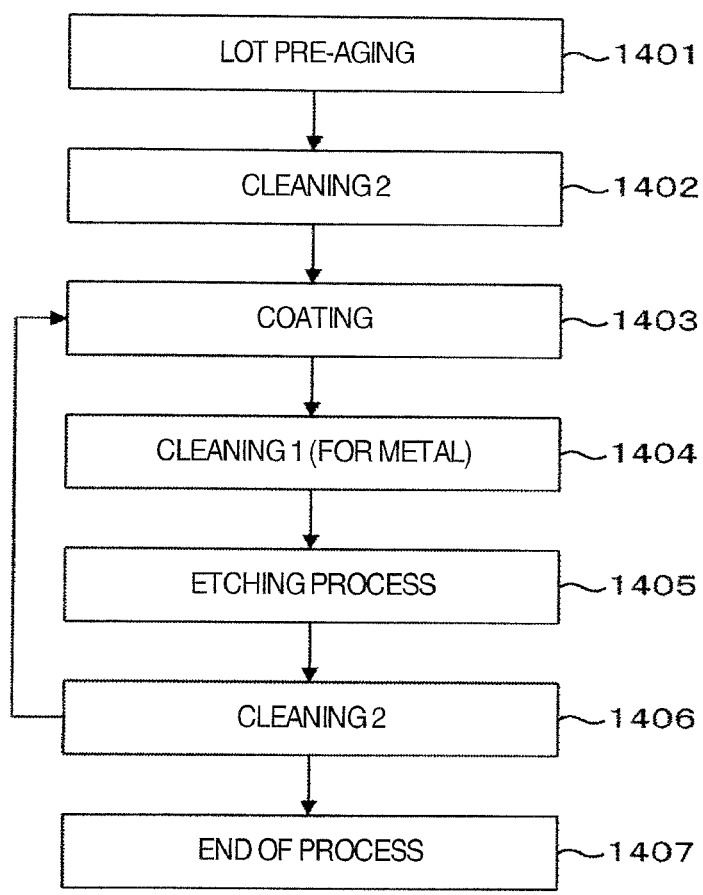
FIG. 14 is a flowchart showing another example of a flow of process including a metal cleaning step in the plasma processing apparatus shown in FIG. 1.

Illustrated in FIG. 14 is a flowchart showing another example of process flow including the metal cleaning step in the plasma processing apparatus shown in FIG. 1. In the second case, the timing for performing the metal cleaning process is different from that in the first case.

While in the first case the metal cleaning process is carried out after completion of the etching process for the film structure of the process objective wafer 112, in the second case, coating films are formed on the surface of members inside the processing chamber 104 and on the wafer mount electrode 111, the wafer 112 is subsequently admitted to the processing chamber 104 and thereafter, in advance of performing the etching process, the metal cleaning process is carried out (step 1404). Even in the second case, like the first case, the status of the surface of members inside the processing chamber 104 can be restored and adjusted in respect of individual wafers 112 and so the process having high reproducibility and generating less the particles can be realized.

Figure 15:
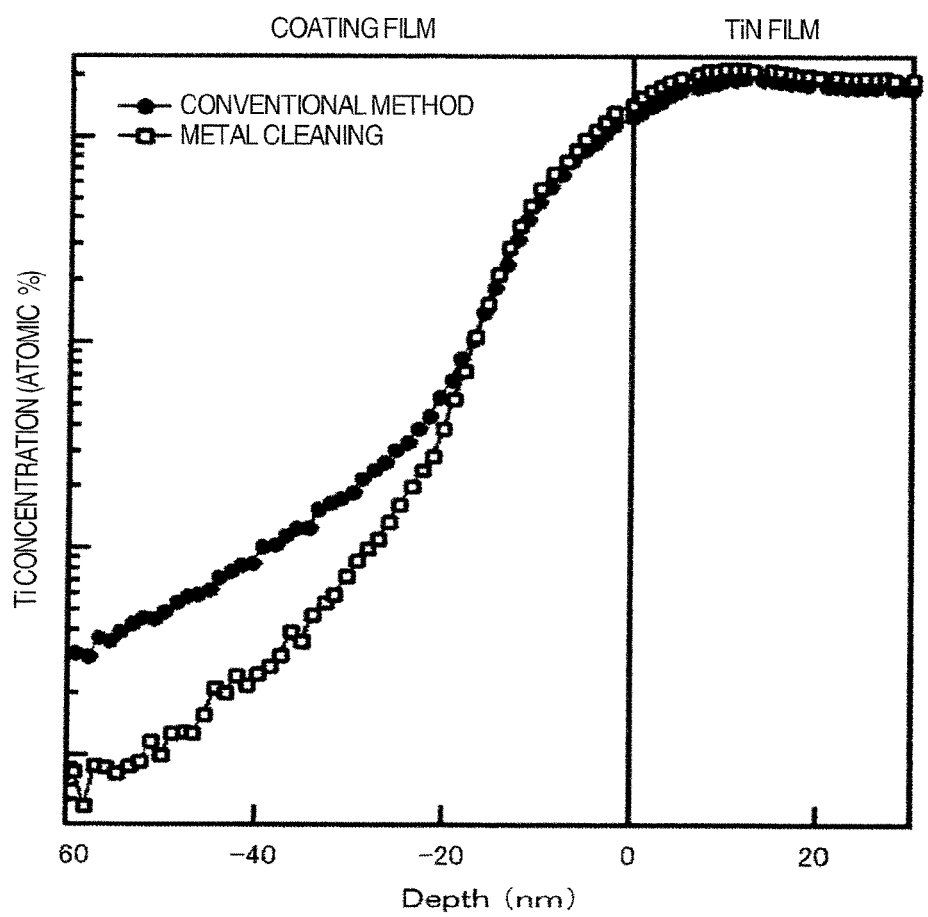
FIG. 15 is a graph showing changes in concentration of a metal component in relation to depths in the coating film in the modified example shown in FIG. 14.

Next, an example will be described in which the effect of elimination of metal component by metal cleaning process is measured. Illustrated in FIG. 15 is a graph showing changes in concentration of metal component in relation to the depth in the coating film in the modified example of FIG. 14.

In this measurement, the etching process for the metal film 205 of film structure shown in FIG. 2B is performed in respect of an arbitrary wafer 112 and Ti remains in the processing chamber 104. To simulate the status in which a coating film is laminated on the wafer during the subsequent process for the wafer 112, an Si $O_2$ film is deposited on the TiN film by the plasma process using a mixture gas of $SiCl_4$ and $O_2$. Distribution of Ti's existing throughout the surface region and inner region of the coating film (in this example, $SiO_2$ film) is measured through SIMS (Secondary ion mass spectrometry) and is illustrated graphically in FIG. 15.

In the figure, the negative region of X axis indicates the $SiO_2$ film, its positive region indicates the TiN film and Y axis indicates Ti concentration. As will be seen from the figure, Ti exists also in the $SiO_2$ film. Conceivably, this phenomenon can be accounted for by, for example, the fact that Ti inside the processing chamber 104 diffuses into the $SiO_2$ film or the fact that particles of Ti once freed to the interior of processing chamber 104 through the preceding etching process are again deposited on the sample together with deposition of $SiO_2$.

The present inventors have thought that Ti representing metal component exists as a component of the coating film (in the present example, $SiO_2$ film) and therefore, Ti remaining inside the processing chamber 104 gives rise to the generation of the unevenness in partial gas pressure inside the processing chamber 104 and the changes in processing condition and in characteristics with time as well. On the other hand, to reduce the influence of the remaining Ti, further increasing the coating film thickness is conceivable as effective means but this results in prolongation of the time necessary for coating film formation carried out in respect of the individual wafer process and disadvantageously, the throughput will be lowered.

On the other hand, □ in the figure indicates Ti distribution in the coating film when a plasma process using a mixture gas of $BCl_3$ and $Cl_2$ is carried out as the metal cleaning process after formation of the coating film. As will be seen, when the metal cleaning process is performed, the Ti concentration near the surface decreases as compared to the case of non-execution of the metal cleaning process. Thus, with the metal cleaning process performed, the concentration of Ti representing the metal component existing on the surface of coating film and at a nearby depth position can be reduced. In this manner, the adverse influence the metal component remaining inside the coating film, for example, Ti has upon the atmosphere inside the processing chamber 104 can be reduced, ensuring that a stable plasma process having high reproducibility and generating less the particles can be achieved.

When the mixture gas of SiCl$_4$ and Cl$_2$ is used as the process gas for the metal cleaning process, the effect of elimination of the metal component differs depending on the mixing ratio. For example, there is a tendency toward decrease of Ti remaining amount as the flow rate of SiCl$_4$ increases in relation to the flow rate of Cl$_2$. Through studies, the inventors have found that by making the flow rate ratio between SiCl$_4$ and Cl$_2$ 0.2 or more, changes in characteristics of process such as processing rate can be suppressed. On the other hand, as the flow rate of SiCl$_4$ further increases, products having a component of excessive Si are deposited inside the processing chamber 104 and preferably, in performing the cleaning process for metal component (for example, Ti), the SiCl$_4$/Cl$_2$ flow rate ratio is set to 0.2 to 1.0.

In the present embodiment, the metal cleaning is carried out until the metal amount remaining inside the processing chamber decreases sufficiently. By detecting emission obtained from plasma in the metal cleaning process, the end point of the metal cleaning process can be determined.

Figure 16:
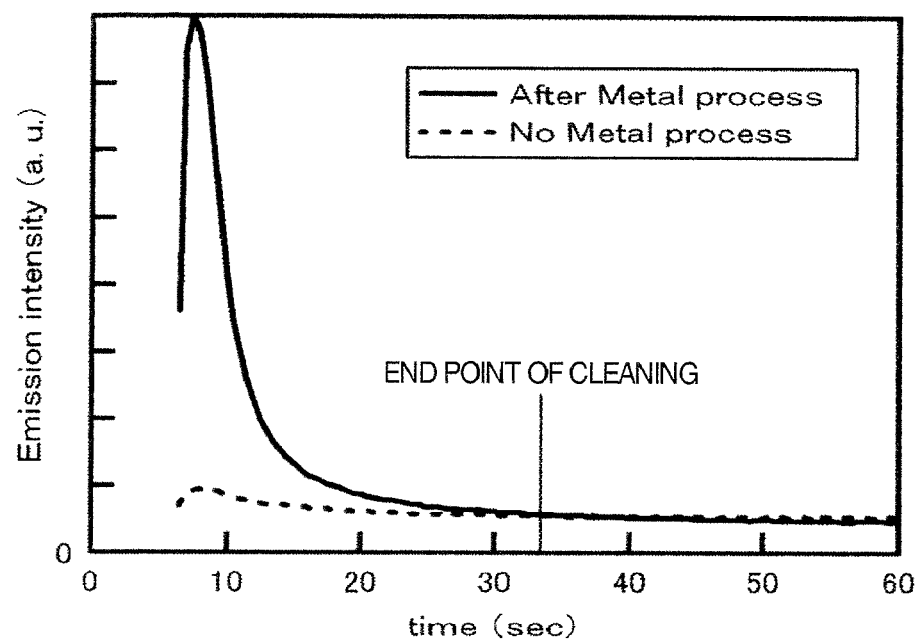
FIG. 16 is a graph showing changes in emission intensity with time attributable to a metal component in the metal cleaning process when the metal film is etched in advance and is not etched in advance.

Turning to FIG. 16, there is illustrated a graph showing changes with time in emission intensity due to the metal component in the metal cleaning process in the case of execution of preparatory film etching process and in the case of non-execution thereof. In this measurement, TiN as the material of the metal film 205 is processed and changes in emission intensity of Ti are measured. In the figure, dotted line corresponds to emission intensity in the case of non-execution of the process for metal and solid line corresponds to that in the case of execution of the metal treatment. When the metal film 205 is processed in advance, the emission intensity decreases with time to continue the cleaning process until the same level as that for non-execution of the metal treatment.

Then, by storing a value of emission intensity in the case of non-execution of the preparatory metal treatment in a memory means such as RAM and comparing an emission intensity of plasma obtained during metal cleaning after processing the film structure containing the metal film 205 with the value stored as a set value, the end point of the process can be determined by using, as the time to end the metal cleaning process, the time that the comparison result shows the value equivalent to the set value.

According to the aforementioned embodiment, the adverse influence the remaining substance inside the processing chamber 104 has upon the process can be reduced and the partial pressure inside the processing chamber 104 and the status of the surface of members inside the processing chamber can be stabilized and consequently, changes in characteristics such as processing rate can be suppressed to suppress changes in the worked shape and eventually, accuracy of working can be improved.

While the foregoing embodiments have been described as especially using ECR plasma for the plasma processing apparatus, the present invention can also be applied to a plasma process using another type of plasma apparatus, for example, induction coupling plasma (ICP) apparatus or capacitor coupling plasma (CCP) apparatus, attaining similar advantages.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for plasma-etching a material to be processed in a processing chamber, comprising:
   in response to determining that the material is not placed in the processing chamber,
      depositing, while the material to be processed is not present in the processing chamber, a deposit film inside the processing chamber to form a surface coating on an inside surface of the processing chamber by using a plasma using at least one of a first mixture gas comprising SiCl$_4$ and O$_2$ and a second mixture gas comprising SiCl$_4$ and methane (CH$_4$); and
   in response to determining that the deposit film has been deposited and that the material to be processed is not present in the processing chamber, plasma-etching a surface of the deposit film, to smooth a surface of the deposit film deposited on the inside surface of the processing chamber, using a first gas comprising a fluorine element and then placing the material to be processed on a sample stage in the processing chamber,
   in response to determining that the material to be processed is placed on the sample stage,
      plasma-etching the material,
   in response to determining that the material has been plasma-etched,
      plasma-cleaning an interior portion of the processing chamber using a second gas comprising the fluorine element, the second gas being different from the first gas.

2. The plasma processing method according to claim 1, wherein
   the first gas comprises SF$_6$ gas, and
   the gas used for generating the plasma for plasma-etching the surface of the deposit film is different from the gas for generating the plasma for plasma-cleaning.

3. The plasma processing method according to claim 1, wherein
   the gas used for generating the plasma for deposing the deposit film inside the processing chamber does not include SF$_6$ gas.

4. The plasma processing method according to claim 2, wherein
   the second gas comprises NF$_3$ gas.

5. A plasma processing method of plasma-etching a material to be processed in a processing chamber, comprising:
   in response to determining that the material to be processed is not placed in the processing chamber,
      depositing, while the material to be processed is not present in the processing chamber, a deposit film in the processing chamber by using a plasma using a gas comprising a silicon element; and
   in response to determining that the deposit film has been deposited and that the material to be processed is not present in the processing chamber, plasma-etching a surface of the deposit film using an SF$_6$ gas and then placing the material to be processed on a sample stage in the processing chamber,
   in response to determining that the material to be processed is placed on the sample stage,
      plasma-etching the material,
   in response to determining that the material has been plasma-etched, plasma-cleaning an interior portion of the processing chamber using a $NF_3$ gas.

\* \* \* \* \*